(12) United States Patent
Uchiyama (10) Patent No.: US 6,357,111 B1
(45) Date of Patent: Mar. 19, 2002

(54) INTER-ELECTRODE CONNECTION STRUCTURE, INTER-ELECTRODE CONNECTION METHOD, SEMICONDUCTOR DEVICE, SEMICONDUCTOR MOUNTING METHOD, LIQUID CRYSTAL DEVICE, AND ELECTRONIC APPARATUS (75) Inventor: Kenji Uchiyama, Hotaka-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/202,846

(22) PCT Filed: Apr. 21, 1998

(86) PCT No.: PCT/JP98/01805

§ 371 Date: Dec. 18, 1998

§ 102(e) Date: Dec. 18, 1998

(87) PCT Pub. No.: WO98/48455

PCT Pub. Date: Oct. 29, 1998

(30) Foreign Application Priority Data

Apr. 21, 1997 (JP) .............................................. 9-103716
Apr. 21, 1997 (JP) .............................................. 9-103717

(51) Int. Cl.[7] .......................... H01R 9/00; H05K 3/00; H05K 1/00
(52) U.S. Cl. ......................... 29/842; 174/254; 174/260; 174/257; 29/825; 29/846
(58) Field of Search ............................... 361/749, 750, 361/751; 174/254, 260, 257; 29/839, 843, 832, 825, 850, 846, 848, 842

(56) References Cited

U.S. PATENT DOCUMENTS 5,672,400 A * 9/1997 Hansen et al.
5,936,850 A * 8/1999 Takahashi et al.
5,951,304 A * 9/1999 Wildes et al.

FOREIGN PATENT DOCUMENTS

| JP | 52-40972 | 3/1977 |
| JP | 59-222954 | 12/1984 |
| JP | 6-112273 | 4/1994 |
| JP | 6-120294 | 4/1994 |
| JP | 6-138473 | 5/1994 |
| JP | 9-97812 | 4/1997 |

* cited by examiner

*Primary Examiner*—Kamand Cuneo
(74) *Attorney, Agent, or Firm*—Harness, Dickey & Pierce, P.L.C.

(57) ABSTRACT

Conductive connection can be effected between electrodes arranged at a minute pitch. When joining an IC chip (36), which is a semiconductor device, to an external substrate (32a), conductive paste (41) is sprayed in particles to terminals (37) on the external substrate (32a) and the conductive paste (41) is put on the electrodes (37). Next, positioning of pads (38) of the IC chip (36) is effected with respect to the conductive paste (41) and, in this condition, the IC chip (36) and the substrate (32a) are glued to each other. Since the conductive paste (41) is sprayed in particles and printed on the electrodes (37), it is possible to correctly put the conductive paste (41) thereon even when the electrodes (37) are arranged at a minute pitch. Further, since conduction is effected between the pads (38) and the electrodes (37) through the conductive paste (41), the conduction state is stable. This conductive connection method is suitably applicable to the connection between substrate side electrodes formed on a substrate and element side electrodes formed on an electronic element mounted on the substrate in a variety of devices such as liquid crystal devices and electronic apparatuses.

35 Claims, 10 Drawing Sheets

INTER-ELECTRODE CONNECTION STRUCTURE, INTER-ELECTRODE CONNECTION METHOD, SEMICONDUCTOR DEVICE, SEMICONDUCTOR MOUNTING METHOD, LIQUID CRYSTAL DEVICE, AND ELECTRONIC APPARATUS

TECHNICAL FIELD

The present invention relates to conductive connection between elements by using conductive paste. In particular, the present invention relates to an inter-electrode connection structure for effecting conductive connection between substrate side electrodes formed on a substrate and element side electrodes formed on electronic elements mounted on the substrate and to an inter-electrode connection method for realizing the structure. Further, the present invention relates to a semiconductor device formed so as to include an IC chip, and to a semiconductor mounting method for joining such a semiconductor device to an external substrate such as a PCB (printed circuit board). Further, the present invention relates to a liquid crystal device and an electronic apparatus produced by using the semiconductor device and the semiconductor mounting method.

BACKGROUND ART

Nowadays, a liquid crystal device is widely used as the visible image display section of various electronic apparatuses, such as a portable telephone and a video camera. Various kinds of semiconductor devices are arranged in such a liquid crystal device and electronic apparatus. By a semiconductor device it is meant here an IC chip, an IC structure in which an IC chip and a substrate are formed into an integral unit, or the like. Known IC chips include a bare chip IC which has undergone no packaging and an IC which has undergone packaging and which has terminals on its back side. Known examples of such an IC structure include a COB (chip on board), in which a plurality of ICs are mounted on a single substrate, an MCM (multi chip module), and a COF (chip on film) in which an IC is mounted on an FPC (flexible printed circuit).

Conventionally, when connecting a semiconductor device to an external substrate or, further, when joining a liquid crystal driving IC to a light transmitting substrate in a liquid crystal device, mounting methods such as wire bonding and TAB (tape automated bonding) have been used.

Further, when manufacturing the above IC structure, it is necessary to effect conductive connection of electronic elements such as IC chips to a circuit board such as a PCB. Conventionally, to effect such conductive connection, mounting techniques such as wire bonding technique and heat seal technique have been used.

However, in the case of the above conventional mounting methods for semiconductor devices, it is difficult to conduct minute pitch mounting. Thus, it has been difficult to correctly join a semiconductor device or the like having an electrode terminal of a minute pitch of 80 µm or less, in particular, 50 µm or less to an external substrate.

Further, in the case of the above-mentioned mounting technique related to the conductive connection between electrode terminals, it is impossible to connect electrode terminals to each other whose inter-electrode pitch is minute. Further, a large area is required for mounting. For example, in the connection method using the wire bonding technique, an inter-electrode-terminal pitch of approximately 130 µm is the limit, and, in the heat seal technique, an inter-electrode-terminal pitch of approximately 240 µm is the limit. Thus, it is difficult to connect electrode terminals arranged at a minute pitch of 80 µm or less, in particular, 50 µm or less.

In view of this, it is a principal object of the present invention to effect conductive connection of electrode terminals arranged at a minute pitch correctly and with high reliability.

In particular, the present invention has been made in view of the problems in the mounting technique related to the above mentioned conductive connection between electrodes. It is a first object of the present invention to provide an inter-electrode connection structure and an inter-electrode connection method in which conductive connection of electrodes arranged at a minute pitch can be correctly effected and in which the requisite area for the conductive connection can be reduced.

Further, the present invention has been made in view of the problems in the above mounting method for semiconductor devices or the like. It is a second object of the present invention to provide an apparatus and a connection method in which, in relation to the joining of a semiconductor element having minute pitch electrode terminals to a substrate, it is possible to achieve an improvement in the reliability of the joint portion and to achieve an improvement in yield.

DISCLOSURE OF INVENTION

To achieve the above objects, the inter-electrode connection structure, inter-electrode connection method, semiconductor device, semiconductor mounting method, liquid crystal device, and electronic apparatus according to the present invention are constructed as follows:

In the inter-electrode connection structure of the present invention, which is an inter-electrode connection structure for effecting conductive connection between a substrate side electrode formed on a substrate and an element side electrode formed on an electronic element mounted on the substrate, (1) the substrate side electrode and the element side electrode are arranged so as to be in contact with or close to each other, (2) a conductive paste is provided so as to connect the terminals at the contact or proximity portion, and (3) the conductive paste is applied to the contact or proximity portion of the terminals by being sprayed in particles.

In this inter-electrode connection structure, the conductive paste is placed on the terminals by spraying it in particles, so that, even when the electrode pitch is minute, it is possible to correctly place the conductive paste on each of the electrodes, whereby conductive connection between minute pitch electrodes is possible. Further, since the electrodes are connected to each other by using conductive paste, the conductive connection state is stable, thereby achieving an improvement in reliability. Further, since conductive connection is effected with a conductive paste in a particle form, the mounting area may be small.

In the above construction, the "conductive paste" is a paste-like or kneaded-matter-like soft conductive material, and is formed, for example, by dissolving an appropriate conductive material in solvent. Further, as the method for "spraying the conductive paste in particles", it is possible to adopt a well-known fluid spraying method, which has conventionally been known as an ink jet system or the like. This ink jet system can be realized by, for example, a well-known piezoelectric system, a well-known bubble spraying system or the like. The piezoelectric system is a method according to which a fluid such as ink is sprayed in particles by utilizing a force generated by supplying electricity to a piezoelectric element. The bubble spraying system is a method according to which a fluid is sprayed in particles while generating bubbles by partially heating the fluid by using a heat generating substance. It goes without saying that any other appropriate method can be adopted.

Regarding this inter-terminal connection structure, the following forms are possible.

(1) The light transmitting substrate of a liquid crystal panel can be used as the substrate, and a glass substrate with a built-in liquid crystal driving IC can be used as the electronic element. In this form, even when the glass substrate with a built-in IC is long, conductive connection of the glass substrate to the light transmitting substrate can be correctly effected. Further, since the area for the conductive connection may be small, it is possible for the liquid crystal panel to be made generally very small.

(2) A flexible or non-flexible printed circuit board can be used as the substrate, and a multi-layer IC chip can be used as the electronic element. Here, the "multi-layer IC" is a semiconductor element in which a plurality of IC chips are stacked together. Generally speaking, in this multi-layer IC, wiring is provided on the side surface portion of the multi-layer structure, and the element-side electrode is provided at the forward end of the wiring.

(3) A flexible or non-flexible printed circuit board can be used as the substrate, and a plastic film liquid crystal panel (PFP) can be used as the electronic element. In the PFP, a pair of light transmitting substrates sandwitching the liquid crystal of a liquid crystal panel are formed not by a glass but by a plastic film. The PFP is lighter than a liquid crystal panel using a glass substrate, and, since it is a plastic film, it can be bent. In the present invention, conductive paste is supplied to the sections between the individual electrodes, so that, even in the case in which a plastic film that is easily bent is used as the substrate, conductive connection of each of the terminals can be correctly effected.

In the inter-electrode connection method of the present invention, which is an inter-electrode connection method for effecting conductive connection between a substrate side electrode formed on a substrate and an element side electrode formed on an electronic element, (1) the substrate side electrode and the element side electrode are arranged so as to be in contact with or close to each other, and (2) conductive paste is sprayed in particles to the contact portion or proximity portion of the electrodes to connect the electrodes to each other by the conductive paste.

The advantages of the inter-electrode connection structure and the inter-electrode connection method of this invention will be summarized: since the conductive paste is put on the section between the electrodes by spraying it in particles, it is possible to correctly put the conductive paste on each of the electrodes even when the electrodes are arranged at a minute pitch, thereby making it possible to effect conductive connection of electrodes arranged at a minute pitch. Further, since the electrodes are connected to each other by using a conductive paste, the conductive connection state is stable, whereby an improvement is achieved in terms of reliability. Further, since the conductive connection is effected by a conductive paste in a particle form, the mounting area may be small.

Further, in the inter-electrode connection structure of the present invention, the electrodes are connected individually by means of a conductive paste, so that conductive connection of the individual electrodes can be correctly effected even in the case in which the substrate with a built-in IC is long.

In accordance with the present invention, there is further provided a semiconductor device which has a built-in semiconductor and which is equipped with a plurality of externally exposed electrodes, wherein there is provided a conductive paste that is sprayed in particles and put on each terminal. The conductive paste put on the electrode can be used as a bump, that is, a protruding electrode. Examples of such a semiconductor device include a bare chip IC that is an IC before packaging, an IC which has undergone packaging and which has an electrode on the back side, COB, MCM and COF.

In this semiconductor device, a conductive paste is put on each electrode by spraying it in particles, so that the conductive paste in particle form can be correctly put on each electrode even in the case of electrodes arranged at a minute pitch, whereby it is possible to correctly effect conductive connection of electrodes arranged at a minute pitch without a hitch.

In this construction, it is possible to adopt the same "conductive paste" and method of "spraying conductive paste in particles" as mentioned above.

Further, in accordance with the present invention, there is provided a semiconductor mounting method for joining a semiconductor device which has a built-in semiconductor and which is equipped with a plurality of externally exposed electrodes to an external substrate, wherein (1) a conductive paste is sprayed in particles at least to an electrode on the external substrate or to the terminal of the semiconductor device to put it on the electrodes and (2) relative positioning of the semiconductor device and the external substrate is effected to glue them to each other.

In this semiconductor mounting method, the conductive paste is sprayed in particles to thereby put it on the individual electrodes, so that it is possible to put the conductive paste in particle form correctly on the individual electrodes even when the electrodes are arranged at a minute pitch, whereby it is possible to correctly effect conductive connection of minute-pitch electrodes without a hitch. Further, since the electrodes are connected to each other by using a conductive paste, the conductive connection state is stable and an improvement in reliability is achieved.

Regarding this semiconductor mounting method, the following forms are possible:

(1) The semiconductor device conductively connected to the external substrate using the conductive paste may exhibit some fastening force itself. However, when a still firmer fastened state is desired, it is desirable that the semiconductor device be firmly attached to the external substrate by curing resin after gluing the semiconductor device and the substrate to each other. This curing resin may be supplied to the border region between the external substrate and the semiconductor device after performing relative positioning on them, or it may be supplied in advance to the section between them before performing relative positioning on them.

(2) The process of spraying the conductive paste in particles can be performed a plurality of times on the same part of the external substrate and/or the semiconductor device. This makes it possible to increase the height of the conductive paste put on the electrode in accordance with the times that the spraying is performed, whereby reliable conduction is obtained even when the recess of the electrode portion of the semiconductor device is deep.

(3) When the spraying of the conductive paste is executed a plurality of times as described above, it is desirable that a drying process be executed on the conductive paste sprayed on the external substrate and/or the semiconductor device before the next spraying of conductive paste is performed. This makes it possible to prevent the conductive paste from being crushed, whereby it is possible to effectively set the height of the conductive paste.

In accordance with the present invention, there is further provided a liquid crystal device which includes a pair of light transmitting substrates opposed to each other with a liquid crystal placed therebetween and a liquid crystal driving IC joined to at least one of the light transmitting substrates, wherein conductive connection between the electrode on the light transmitting substrate and the electrode terminal of the liquid crystal driving IC is effected through a conductive paste which is sprayed in particles and put on at least one of the electrodes.

In accordance with the present invention, there is further provided an electronic apparatus comprising a semiconductor device having a built-in semiconductor and equipped with a plurality of externally exposed terminals and an external substrate on which the semiconductor device is mounted, wherein conductive connection is effected between the electrode of the external substrate and the electrode terminal of the semiconductor device through a conductive paste which is sprayed in particles and put on at least one of the electrodes.

The advantages of the semiconductor device and the semiconductor device mounting method of the present invention will be summarized: since a conductive paste is sprayed in particles and put on the individual electrodes, it is possible to correctly put conductive paste in particle form on the individual electrodes even when the electrode terminals are arranged at a minute pitch, whereby it is possible to correctly effect conductive connection between minute-pitch electrodes without a hitch. Further, since the electrodes are connected to each other by using a conductive paste, the conductive connection state is stable and an improvement is achieved in terms of reliability.

Further, in a form of the semiconductor mounting method of the present invention, it is possible to fasten a semiconductor device to an external substrate in a simple and reliable manner.

Further, in another form of the semiconductor mounting method of the present invention, it is possible to increase the height of the conductive paste.

Further, in still another form of the semiconductor mounting method of the present invention, it is possible to effectively increase the height of the conductive paste.

Further, in the liquid crystal device of the present invention, it is possible to form the electrode terminals of a liquid crystal driving IC at a minute pitch, so that the size of the liquid crystal driving IC can be reduced when driving a liquid crystal panel of the same area.

BEST MODE FOR CARRYING OUT THE INVENTION

First Embodiment

The first embodiment of the present invention will be described with reference to FIGS. 1 through 3.

Figure 1:
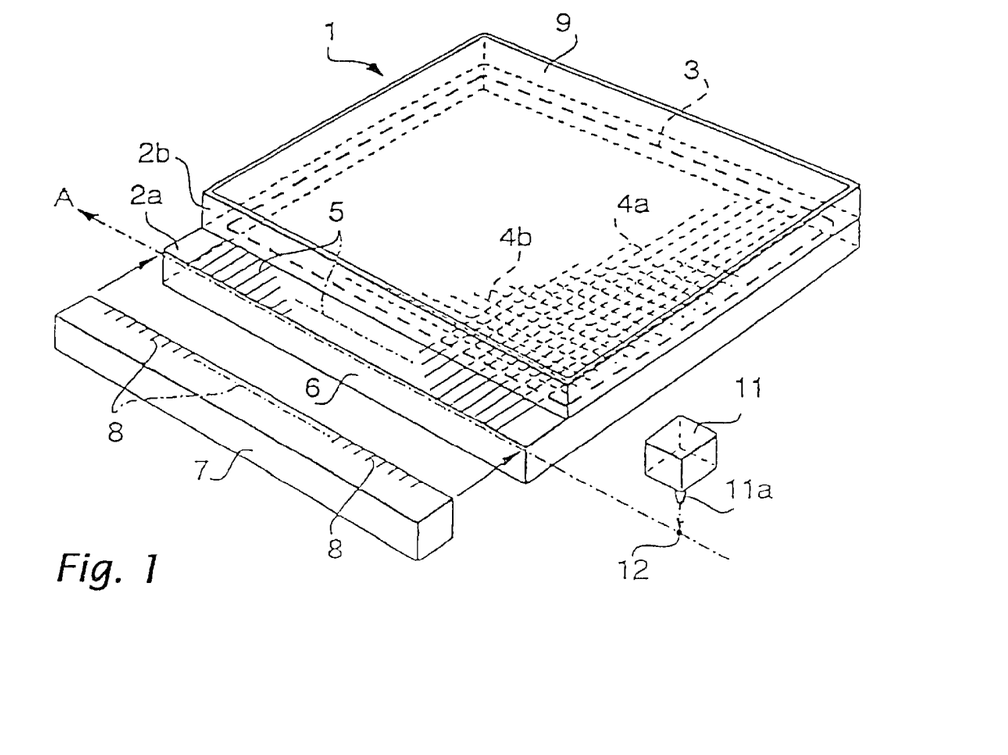
FIG. 1 is a perspective view of a first embodiment of the present invention showing an inter-electrode connection structure and an inter-electrode connection method.

FIG. 1 shows an inter-electrode connection method according to an embodiment of the present invention. In this embodiment, a light transmitting substrate of a liquid crystal panel is used as the substrate, and a glass substrate having a built-in liquid crystal driving IC is used as the electronic element. In the drawing, a liquid crystal panel 1 has a pair of opposite light transmitting substrates 2a and 2b. A seal material 3 in the form of a rectangular frame is printed on one of these substrates 2a and 2b, and, by means of this seal material 3, the substrates 2a and 2b are glued together. Further, a liquid crystal is sealed in a gap, a so-called cell gap, defined between the substrates 2a and 2b.

On the surface of one substrate 2a, a plurality of linear light transmitting electrodes 4a (partially omitted) are formed by photolithography processing. On the surface of the other substrate 2b, a plurality of linear light transmitting electrodes 4b (partially omitted) are formed by photolithography processing. One substrate 2a protrudes to the exterior of the other substrate 2b, and a plurality of substrate side electrodes 5 are formed on the protruding portion. The light transmitting electrodes 4a formed on the substrate 2a are directly connected to these substrate side electrodes 5. The light transmitting electrodes 4b formed on the substrate 2b are connected to the substrate side electrodes 5 (the dashed-line portion being omitted) through a conductive material (not shown) arranged between the substrate 2b and the substrate 2a.

In this way, the liquid crystal panel 1 is formed, and the following attachments are mounted to the liquid crystal panel 1. First, a substrate 7 with a built-in IC is mounted to a side end surface 6 of the substrate 2a. That is, the substrate 7 with a built-in IC is mounted to the side end surface 6 of the substrate 2a and, further, conductive connection is effected between the substrate side electrodes 5 on the light transmitting substrate 2a and element side electrodes 8 on the substrate 7 with a built-in IC (the dashed-line portion being omitted). The substrate 7 with a built-in IC is prepared by forming a transistor or the like on a glass substrate by using a low temperature polysilicon. Further, a polarizer 9 is glued to the outer side surfaces of the light transmitting substrates 2a and 2b. Further, as needed, the backlight (not shown) of one of the light transmitting substrates 2a and 2b is mounted.

The process for mounting the substrate 7 with a built-in IC to the liquid crystal panel 1 will be described in detail. First, the substrate 7 with a built-in IC is mounted to the side end surface 6 of the substrate 2a such that the element side electrodes 8 on the substrate 7 with a built-in IC are brought into contact with or close to the substrate side electrodes 5 on the substrate 2a. This mounting is preferably conducted by using a fastening means such as an adhesive tape or an adhesive.

After this, as indicated by an arrow A, a paste spraying device 11 is moved along the joint section between the substrate 2a and the substrate 7 with a built-in IC. This paste spraying device 11 has a structure similar to that of an ink jet head used in a well-known ink jet printer. As for the construction of the ink jet head, there is often adopted, for example, a construction in which ink is ejected from a nozzle by using a piezoelectric element that generates power by supplying electricity thereto, or a construction in which ink is ejected from a nozzle while generating a bubble by locally heating the ink by a heat generating member. The paste spraying device 11 of this embodiment may also be formed by using such a construction. Of course, in this embodiment, conductive paste is sprayed instead of ink.

Figure 2:
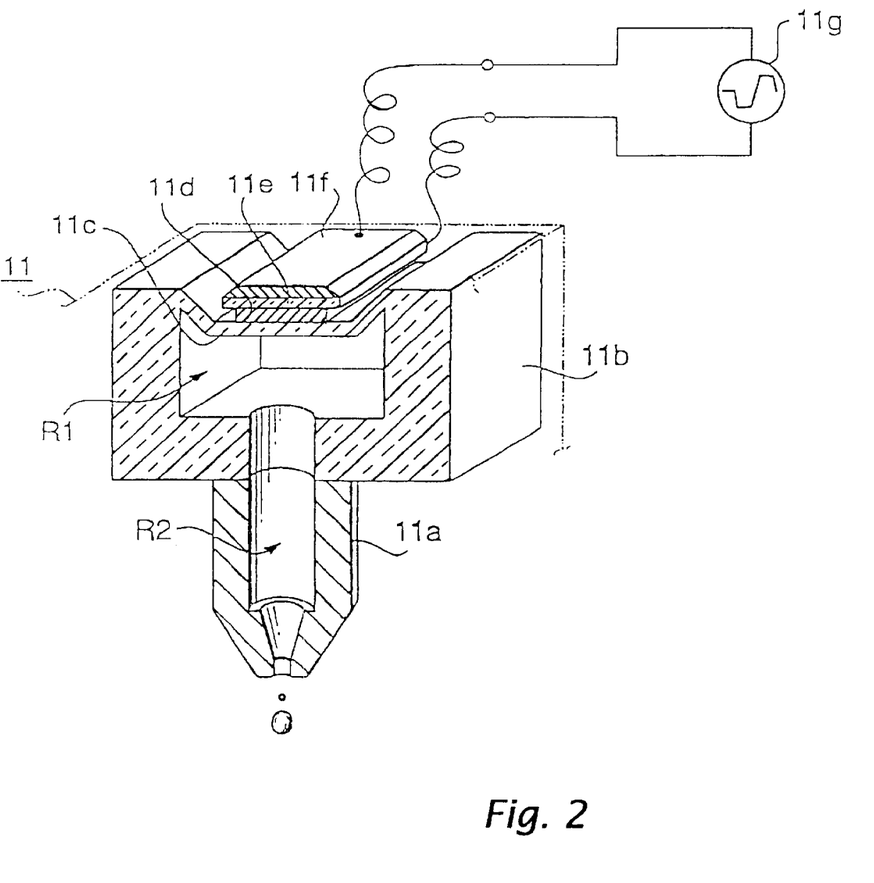
FIG. 2 is a partially cutaway structural schematic diagram showing an example of a paste spraying device.
Figure 3:
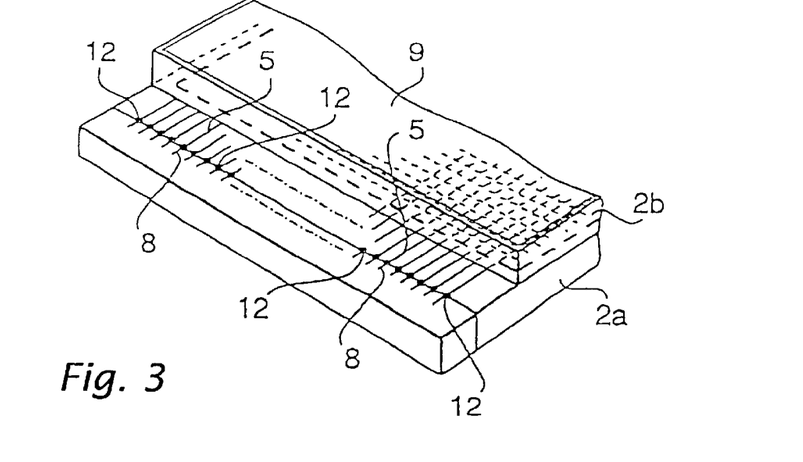
FIG. 3 is a perspective view showing the condition in which mounting has been completed with respect to the embodiment of FIG. 2.

FIG. 2 schematically shows an example of the paste spraying device 11. In this paste spraying device 11, which is based on the above-described ink jet system, an ejection nozzle 11a (spraying nozzle) protrudes from under a substantially box-like head main body 11b. The head main body 11b is formed of a ceramic material and has inside a paste chamber R1 for collecting liquid conductive paste. The ejection nozzle 11a is formed, for example, of metal, and an ejection duct R2 is formed within it. This ejection duct R2 communicates with the paste chamber R1. Further, the paste chamber R1 is constantly supplied with conductive paste through a supply hole (not shown). The top wall of the head main body 11b is formed as a thin recessed wall to form an oscillation plate 11c. Provided on the upper surface of this oscillation plate 11c is a driving section formed by stacking together a lower electrode 11d, a piezoelectric element 11e and an upper electrode 11f, each in the form of a plate. The lower electrode 11d and the upper electrode 11f are connected to a pulse power source 11g, and a pulse driving signal (electric signal) for ejecting the conductive paste, which has a controlled driving waveform, is supplied from the pulse power source 11g.

Thus, when the piezoelectric element 11e mechanically oscillates in response to the pulse driving signal, a pulse-like change in volume occurs in the paste chamber R1 as a result of this oscillation, and, due to the force generated by this change in volume, the conductive paste passes through the ejection duct R2 and is ejected to the exterior as conductive paste in the form of particles.

Thus, the paste ejection device 11 is moved along the scanning line A, and, each time the ejection nozzle 11a of the paste spraying device 11 reaches a section where the substrate side electrodes 5 and the element side electrodes 8 are in contact with or close to each other, a predetermined amount of conductive paste is sprayed in the form of particles from the ejection nozzle 11a. As a result, when the paste spraying device 11 has passed the joint portion of the substrate 2a and the substrate 7 with a built-in IC, conductive paste 12 (the dashed-line portion being omitted) is printed or put on all every section where the substrate side electrodes 5 and the element side electrodes 8 are in contact with or close to each other, as shown in FIG. 3, whereby their terminals 5 and 8 conduct.

In this way, in this embodiment, the conductive paste 12 is supplied to the joint sections of the terminals 5 and 8 in the form of particles by using an ink jet type fluid ejection structure, so that even when the electrodes 5 and 8 are arranged at a minute pitch of 80 μm or less, in particular, 50 μm or less, it is possible to correctly put the conductive paste 12 on their joint sections, so that conduction can be correctly achieved between the electrodes.

Second Embodiment

The second embodiment of the present invention will be described with reference to FIG. 4.

Figure 4:
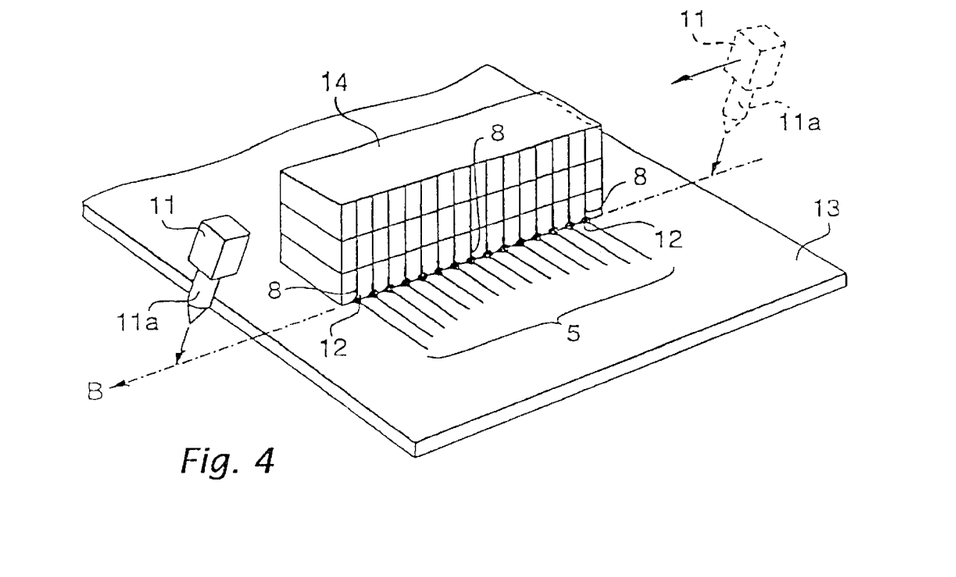
FIG. 4 is a perspective view of another embodiment showing an inter-electrode connection structure and an inter-electrode connection method as a second embodiment of the present invention.

FIG. 4 shows another embodiment of an inter-electrode connection method and an inter-electrode connection structure of the present invention. In this embodiment, a PCB (printed circuit board) 13 is used as the substrate, and a multi-layer IC 14 is used as the electronic element. The inter-electrode connection method of the present invention is used for the purpose of effecting conductive connection between substrate side electrodes 5 formed on the PCB 13 and element side electrodes 8 formed in the lower section of a side surface of the multi-layer IC 14. As is well known, the multi-layer IC 14 is an electronic element in which a plurality of IC chips are stacked together and in which signals are exchanged between the IC chips through wiring formed on their side surface.

In this embodiment, the multi-layer IC 14 is placed at a predetermined position on the PCB 13, and, as indicated by the arrow B, the paste spraying device 11 is moved along the section where the substrate side electrodes 5 and the element side electrodes 8 are in contact with or close to each other. Each time the ejection nozzle 11a of the paste spraying device 11 reaches each of the electrode joint sections, the conductive paste 12 is ejected from the ejection nozzle 11a in the form of particles, whereby dot-like conductive paste 12 is printed or put on each electrode joint section to thereby effect conduction between the substrate side electrodes 5 and the element side electrodes 8.

Third Embodiment

The third embodiment of the present invention will be described with reference to FIG. 5.

Figure 5:
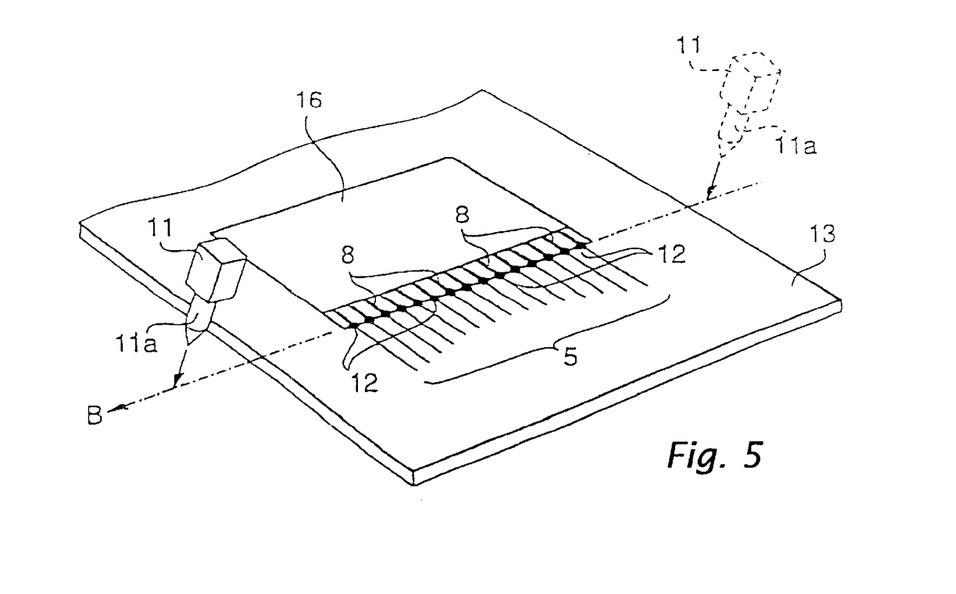
FIG. 5 is a perspective view of another embodiment showing an inter-electrode connection structure and an inter-electrode connection method as a third embodiment of the present invention.

FIG. 5 shows still another embodiment of an inter-electrode connection method and an inter-electrode connection structure of the present invention. In this embodiment, a PCB (printed circuit board) 13 is used as the substrate, and a PFP (plastic film panel) 16 is used as the electronic element. To effect conductive connection between substrate side electrodes 5 formed on the PCB 13 and element side electrodes 8 formed in the edge portion of a light transmitting substrate, that is, a plastic substrate, of the PFP 16, the inter-electrode connection method of the present invention is used.

In this embodiment, the PFP 16 is placed at a predetermined position on the PCB 13 and, as indicated by the arrow B, the paste spraying device 11 is moved along the section where the substrate side electrodes 5 and the element side electrodes 8 are in contact with or close to each other. Each time the ejection nozzle 11a of the paste spraying device 11 reaches each of the electrode joint sections, conductive paste 12 is ejected from the ejection nozzle 11a in the form of particles, whereby dot-like conductive paste 12 is printed or put on each electrode joint section to effect conduction between the substrate side electrodes 5 and the element side electrodes 8. Since the plastic substrate of the PFP 16 is flexible, it is easily bent. However, when, as in this embodiment, the electrodes are individually connected to each other by the conductive paste 12, it is possible to obtain a stable conductive connection state.

Fourth Embodiment

The fourth embodiment of the present invention will be described with reference to FIGS. 6 and 7.

Figure 6:
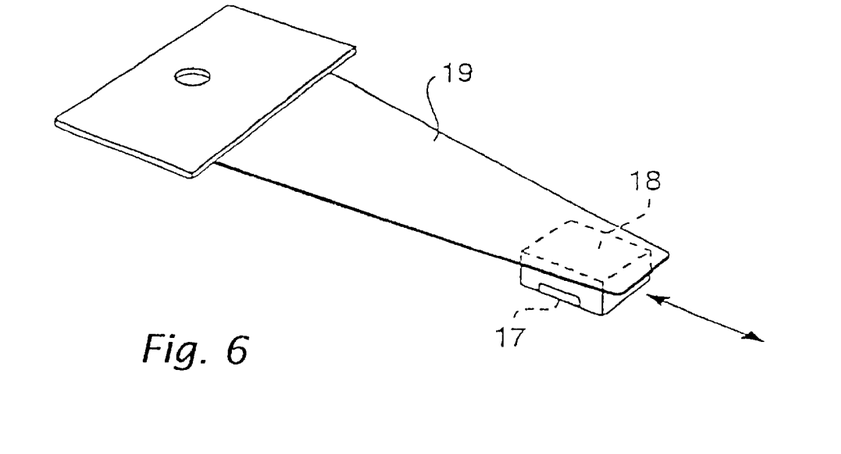
FIG. 6 is a perspective view of another embodiment showing an inter-electrode connection structure and an inter-electrode connection method as a fourth embodiment of the present invention.

FIG. 6 shows another embodiment of the inter-electrode connection method and the inter-electrode connection structure of the present invention. In this embodiment, the present invention is applied to the head portion of a hard disc unit, which is a peripheral equipment of a computer. In the hard disc unit shown, a slider 18 carrying a magnetic head 17 is supported by a resilient suspension 19. In this embodiment, the suspension 19 constitutes the substrate, and the slider 18 constitutes the electronic element.

Figure 7:
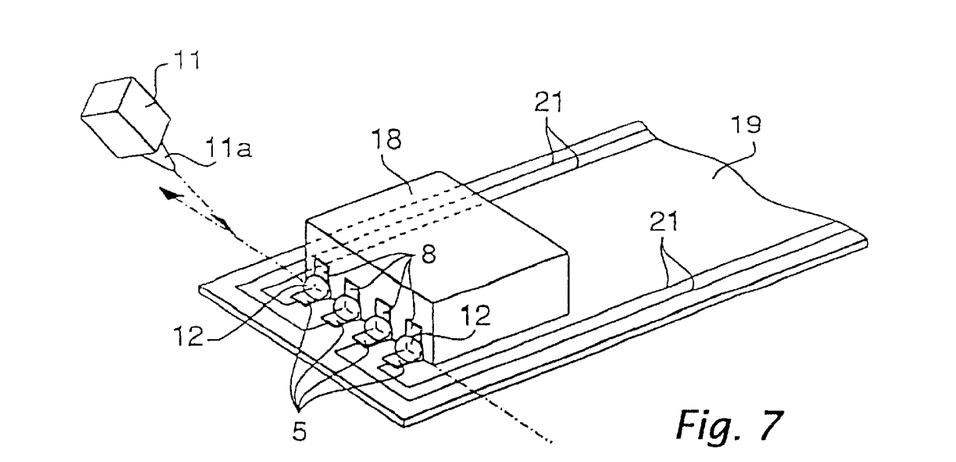
FIG. 7 is a perspective view showing an essential part of the device of FIG. 6.

As shown in FIG. 7, wirings 21 are printed on the suspension 19, and substrate side electrodes 5 are provided at the forward ends of these wirings 21. Further, element side electrodes 8 are formed on a side surface of the slider 18. While scanning the portion where the electrodes 5 and 8 are in contact with or close to each other with the ejection nozzle 11a of the paste spraying device 11, the conductive paste is sprayed in particles on each electrode portion to put the conductive paste 12 on each electrode whereby conductive connection between the electrodes 5 and 8 is effected.

Fifth Embodiment

The fifth embodiment of the present invention will be described with reference to FIGS. 8 and 9.

Figure 8:
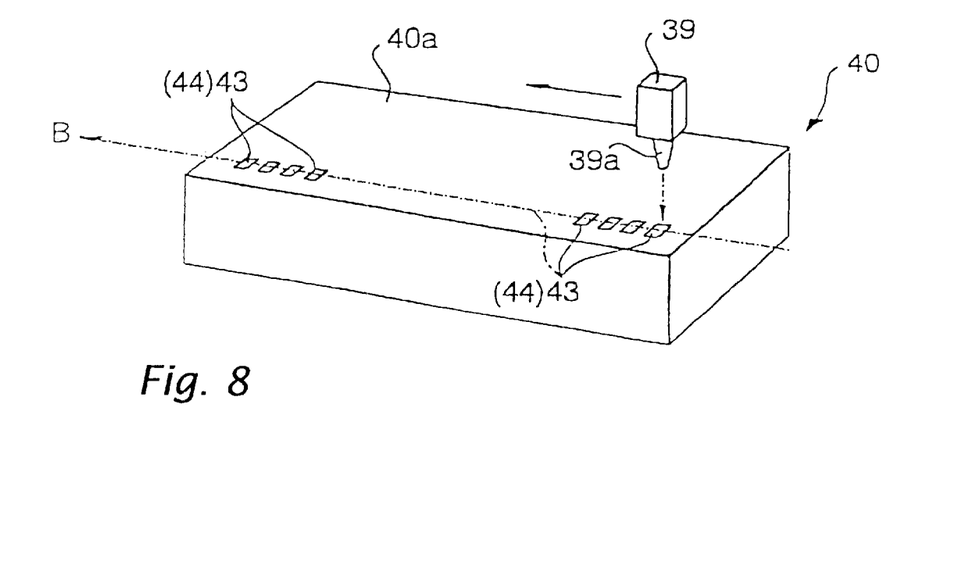
FIG. 8 is a perspective view showing a bare chip IC of a semiconductor device as a fifth embodiment of the present invention.
Figure 9:
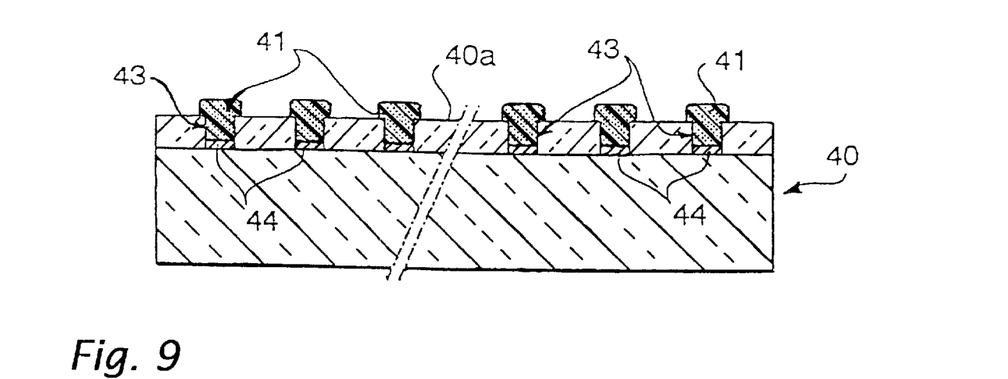
FIG. 9 is a sectional view showing the sectional structure of the electrode terminal portion of the bare chip IC of FIG. 8.

FIG. 8 shows a bare chip IC 40 according to an embodiment of the semiconductor device of the present invention. This bare chip IC 40 contains a circuit constructed to provide a predetermined function, and is formed, for example, as a liquid crystal driving IC or the like for a liquid crystal device. A plurality of recesses 43 are formed on an active surface 40a of this bare chip IC 40 (Those recesses of the dashed line portion in the middle are omitted), and, as shown in FIG. 9, a plurality of aluminum pads 44 serving as electrodes are formed on the bottom surfaces of the recesses 43 (Those aluminum pads of the dashed line portion in the middle are omitted).

Referring again to FIG. 8, the bare chip IC 40 is subjected to paste printing processing using a paste spraying device 39. The paste spraying device 39 may, for example, be constructed in the same manner as that of the above-described first embodiment.

The paste spraying device 39 is moved along the row of recesses 43 as indicated by the arrow B, and, when the ejection nozzle 39a of the paste spraying device 39 reaches each pad 44, a predetermined amount of conductive paste is ejected from the ejection nozzle 39a in the form of particles. Then, as shown in FIG. 9, conductive paste 41 is printed or put on each pad 44. The conductive paste 41 can be used as protruding electrode terminals for conduction to an external circuit, i.e., so-called bumps.

As described above, in this embodiment, the conductive paste 41 is supplied in particle form to the pads 44 by using an ink jet type fluid ejection mechanism, so that, even when the pads 44 are arranged at a minute pitch of 80 μm or less, in particular, 50 μm or less, it is possible to correctly put the conductive paste 41 on these pads 44.

Sixth Embodiment

The sixth embodiment of the present invention will be described with reference to FIGS. 10 and 11.

Figure 10:
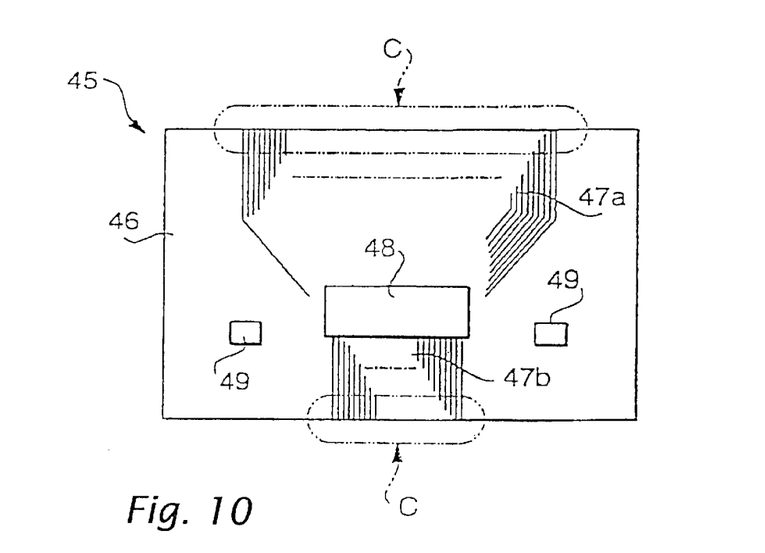
FIG. 10 is a plan view showing an IC structure of a semiconductor device concerning another embodiment as a sixth embodiment of the present invention.
Figure 11:
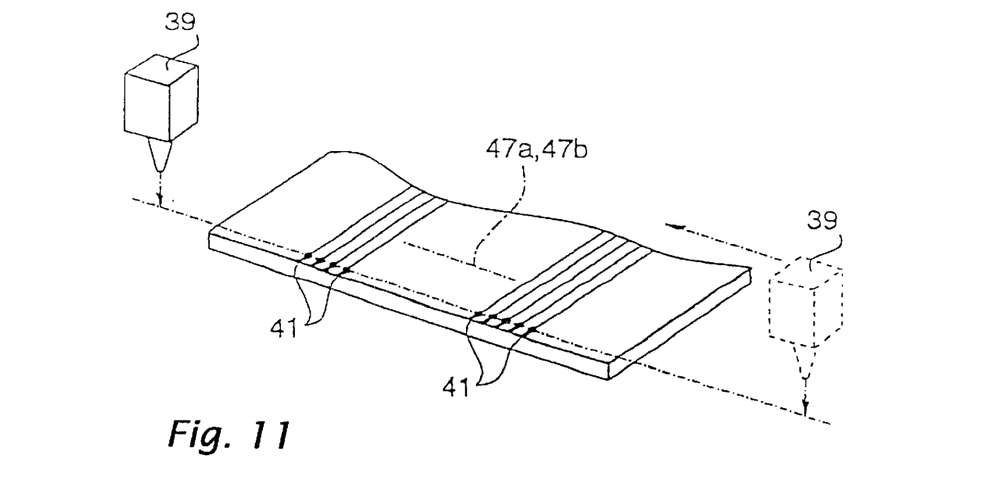
FIG. 11 is a perspective view showing an essential part of FIG. 10.

FIG. 10 shows a COB type IC structure 45 according to another embodiment of the semiconductor device of the present invention. This IC structure 45 is formed by directly connecting an IC chip 48 to electrodes 47a (the portion indicated by the dashed line being omitted) and 47b (the portion indicated by the dashed line being omitted) of a print substrate 46. Around the IC chip 48, circuit components 49, such as chip resistors and chip capacitors, may be arranged.

In this embodiment, the portions indicated by arrows C in the electrodes 47a and 47b correspond to the electrodes of the IC structure 45 as a semiconductor device. As shown in FIG. 11, paste spraying processing using a paste spraying device 39 is executed on each of these electrodes 47a and 47b (the portion indicated by the dashed line being omitted), with the result that conductive paste 41 in particle form is formed at the forward end of each terminal. The conductive paste 41 is used for the purpose of effecting conductive connection between the electrodes 47a and 47b on the print substrate 46 and the electrodes of an external substrate when attaching the IC structure 45 to an external substrate, such as FPC. Since the print substrate 46 forms a semiconductor device in cooperation with the IC chip 48, this print substrate 46 is to be called, for example, "an interior substrate", to distinguish it from the external substrate connected to the semiconductor device.

The bare chip IC 40 as shown in FIG. 8 can be used as a IC chip 48. In that case, the bumps of the IC chip 48 can be formed by conductive paste by using the paste spraying method.

Seventh Embodiment

Figure 12:
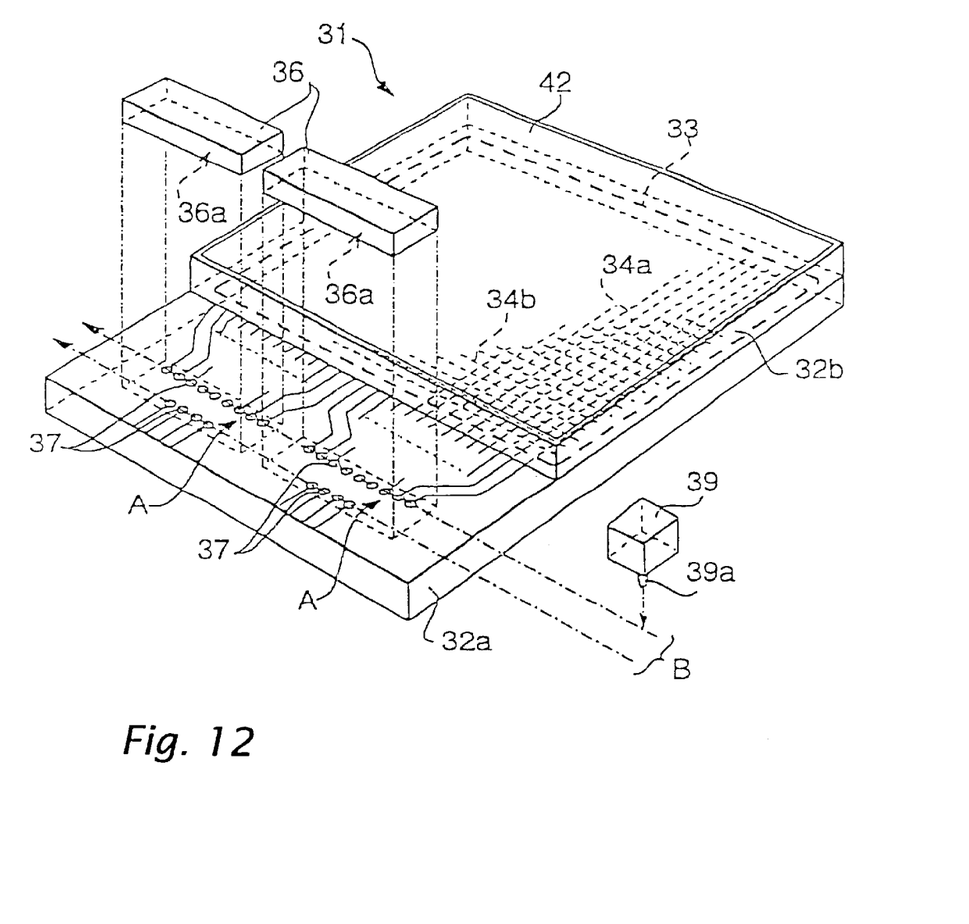
FIG. 12 is a perspective view showing an embodiment of a semiconductor mounting method and an embodiment of a liquid crystal device as a seventh embodiment of the present invention.
Figure 13:
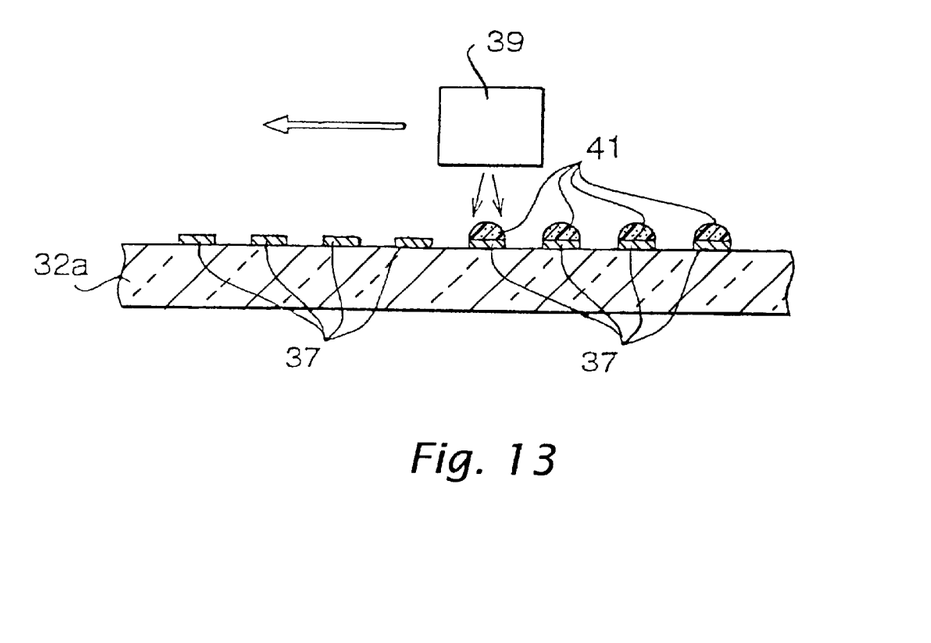
FIG. 13 is a schematic diagram showing a process when the semiconductor mounting method is executed on the device shown in FIG. 12.
Figure 14:
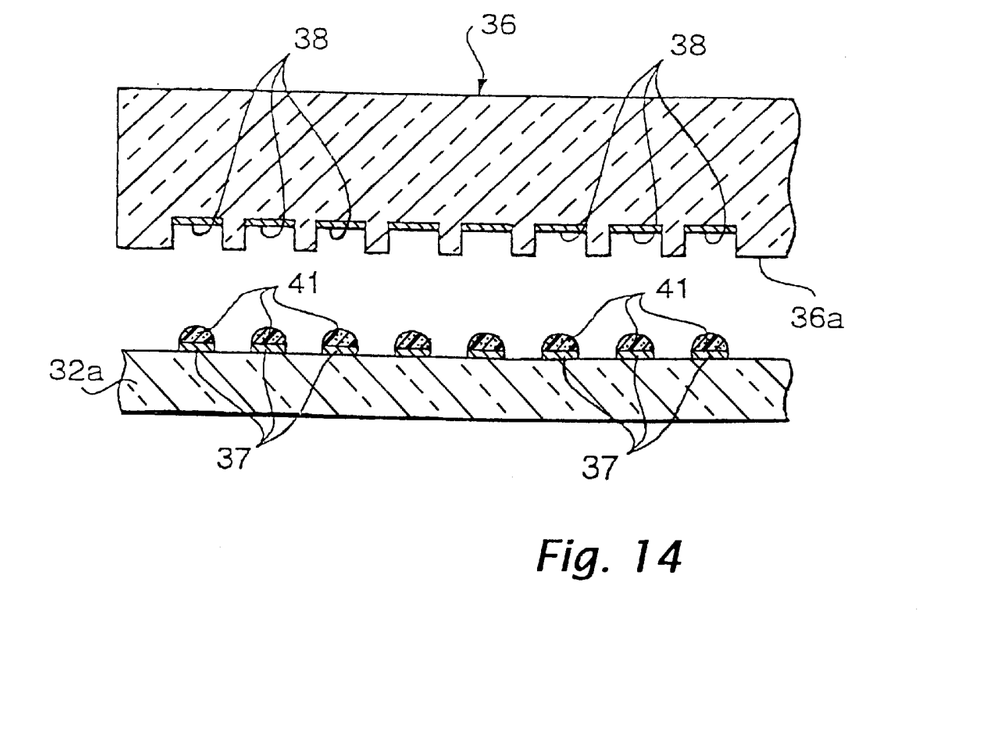
FIG. 14 is a schematic diagram showing another process when the semiconductor mounting method is executed on the device shown in FIG. 12.

The seventh embodiment of the present invention will be described with reference to FIGS. 12 through 14. FIG. 12 shows an embodiment of a semiconductor mounting method according to the present invention, and an embodiment of a liquid crystal device according to the present invention. This liquid crystal device 31 includes a pair of opposite light transmitting substrates 32a and 32b. A seal material 33 in the form of a rectangular frame is printed on one of these substrates 32a and 32b, and the substrates 32a and 32b are attached to each other by means of this seal material 33. Further, a liquid crystal is sealed in the gap defined between the substrates 32a and 32b, that is, the so-called cell gap.

On the surface of one substrate 32a, a plurality of linear light transmitting electrodes 34a (partially omitted) are formed by photolithography processing. Further, on the surface of the other substrate 32b, a plurality of linear light transmitting electrodes 34b (partially omitted) are formed by photolithography processing. One substrate 32a protrudes to the exterior of the other substrate 32b, and, provided on the protruding portion is a mounting area A for mounting a liquid crystal driving IC 36 as the semiconductor device (that is, bare chip IC). The light transmitting electrodes 34a formed on the substrate 32a directly extend to the protruding portion of the substrate 32, and the forward ends thereof are connected to lands 37, i.e., electrode terminals in the mounting area A (the portions indicated by the dotted line being omitted). Further, the light transmitting electrodes 34b formed on the substrate 32b are connected to conductive lines of the protruding portion of the substrate 32a through a conductive material (not shown) arranged between the substrate 32b and the substrate 32a. The forward ends of the conductive lines are connected to the lands 37 in the mounting area A. In this embodiment, the protruding portion of the light transmitting substrate 32a corresponds to the external substrate for joining the liquid crystal driving IC 36 as the semiconductor device.

After attaching the liquid crystal driving IC 36 to the mounting area A, polarizers 42 are glued to the outer surfaces of the light transmitting substrates 32a and 32b. Further, as needed, a backlight is provided on the outer side of one of the light transmitting substrates 32a and 32b.

The liquid crystal driving IC 36 attached to the mounting area A on the light transmitting substrate 32a is a semiconductor device adapted to supply a scanning signal and a data signal to the light transmitting electrodes 34a and 34b. As shown in FIG. 14, provided on the active surface 36a are a plurality of electrode terminals for transmitting and receiving signals to and from the external circuit and for receiving voltage supply from an external power source, that is, pads 38. These pads 38 are usually formed of aluminum or the like.

Referring again to FIG. 12, when mounting the liquid crystal driving IC 36 to the mounting area A of the light transmitting substrate 32a, conductive paste is printed or put on each land 37 by using the paste spraying device 39 prior to the mounting. More specifically, the paste spraying device 39 is moved along the scanning line B, and when the ejection nozzle 39a of the paste spraying device 39 reaches each land 37, a predetermined amount of conductive paste is ejected in the form of particles from the ejection nozzle 39a. Then, as shown in FIG. 13, conductive paste 41 is printed or put on each land 37. As shown in FIG. 14, after conductive paste 41 is put on each land 37, each pad 38 of the liquid crystal driving IC 36 is positioned respect to each land 37 and, then, the liquid crystal driving IC 36 is glued to the substrate 32a. This causes each conductive paste 41 to enter the pad 38 to achieve a reliable conduction between the pad 38 and the land 37. To reliably maintain the connection between the liquid crystal driving IC 36 and the substrate 32a, it is desirable, as needed, to firmly attach the liquid crystal driving IC 36 to the substrate 32a by using curing resin.

As described above, in this embodiment, conductive paste 41 is supplied to the lands 37 in the form of particles by using an ink jet type fluid ejection structure, so that, even when the lands 37 are arranged at a minute pitch of 80 $\mu$m or less, in particular, 50 $\mu$m or less, it is possible to correctly put the conductive paste on the lands. Instead of the lands 37 formed on the light transmitting substrate 32, the conductive paste 41 may be put on the pads 38 of the liquid crystal driving IC 36.

Eighth Embodiment

The eighth embodiment of the present invention will be described with reference to FIGS. 15 and 16.

Figure 15:
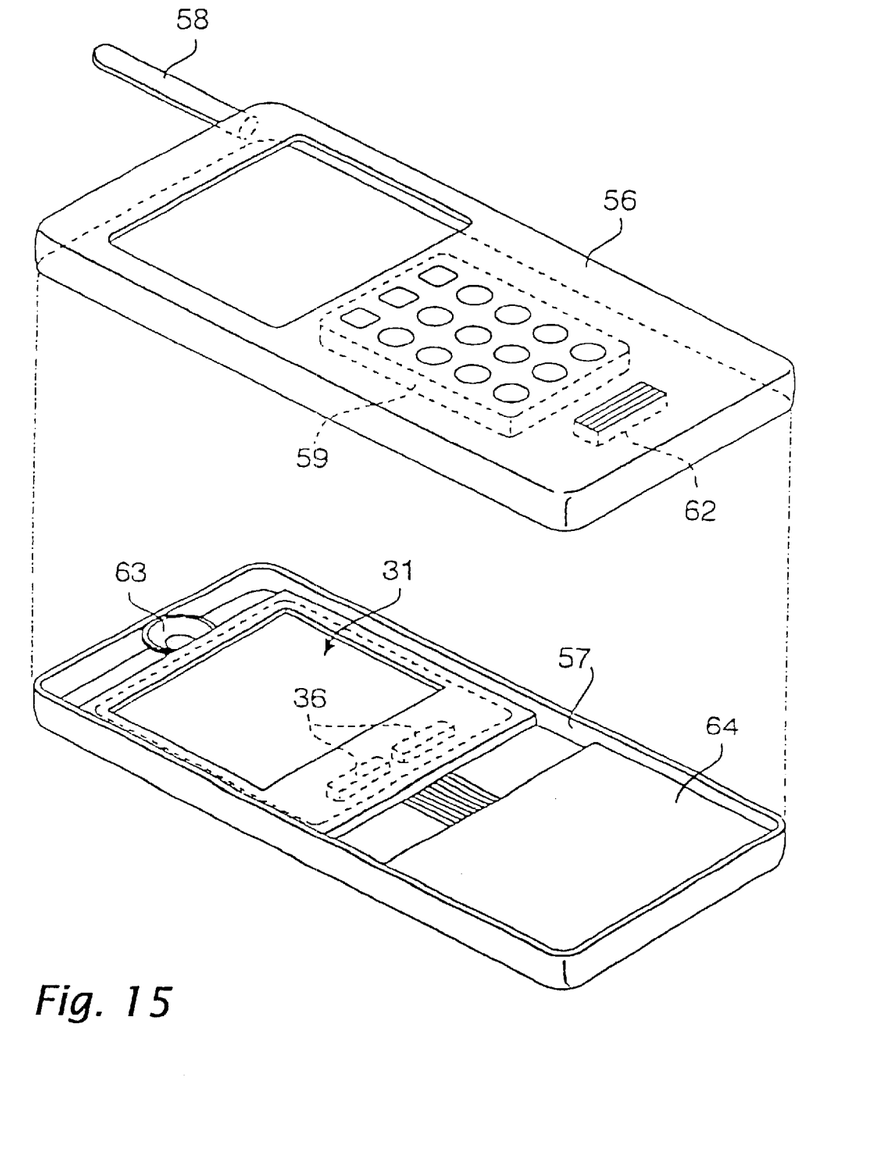
FIG. 15 is a perspective view showing an embodiment of an electronic apparatus as a eighth embodiment of the present invention.
Figure 16:
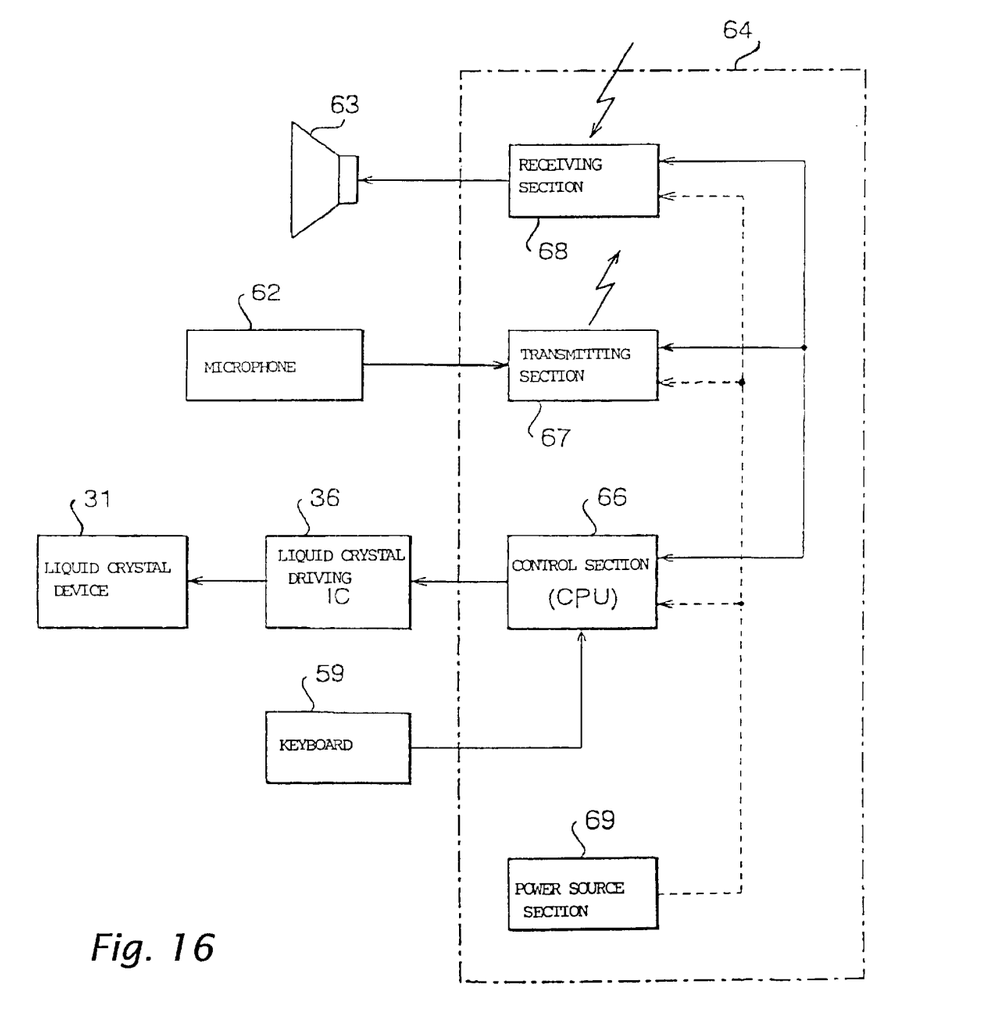
FIG. 16 is a block diagram showing an example of an electric control system used in the electronic apparatus shown in FIG. 15.

FIG. 15 shows an embodiment of a portable telephone as an electronic apparatus including a built-in mounting structure formed by the semiconductor mounting method of the present invention. The portable telephone shown includes an upper case 56 and a lower case 57. The upper case 56 has a transmitting/receiving antenna 58, a keyboard unit 59 and a microphone 62. The lower case 57 has a liquid crystal device 31 as shown, for example, in FIG. 12, a speaker 63 and a circuit substrate 64. As shown in FIG. 16, provided on the circuit substrate 64 are a receiving section 68 connected to the input terminal of the speaker 63, a transmitting section 67 connected to the output terminal of the microphone 62, a control section 66 including a CPU, and a power source section 69 for supplying power to each section. The control section 66 reads the condition of the transmitting section 67 and the receiving section 68 and, on the basis of the result, supplies information to a liquid crystal driving IC 36 to display visible information in the effective display area of the liquid crystal device 31. The control section 66 supplies information to the liquid crystal driving IC 36 on the basis of the information output from the keyboard unit 59 to display visible information in the effective display area of the liquid crystal device 31.

Other Embodiments

While the present invention has been described with reference to preferred embodiments thereof, the present invention is not restricted to these embodiments but various modifications are possible without departing from the scope of the invention as described in the claims.

For example, the electronic element, which is the object of mounting, is not restricted to a substrate with a built-in IC, a multi-layer IC or PFP. It may be some other arbitrary electronic element equipped with electrodes. Further, the substrate on which the electronic element is mounted is not restricted to a light transmitting substrate of a liquid crystal panel or a PCB. It may be an arbitrary device which needs an electronic element to be mounted.

Further, for example, the semiconductor mounting method of the present invention is not restricted to a liquid crystal device; it is applicable to various devices containing a structure in which a semiconductor device such as an IC chip is joined to an external substrate such as a light transmitting substrate.

While the liquid crystal device shown in FIG. 12 is a so-called COG (chip on glass) type liquid crystal device in which a liquid crystal driving IC is directly mounted on a substrate, the present invention is also applicable to other types of liquid crystal device.

Further, while a portable telephone is shown in FIG. 15 as an example of the electronic apparatus, the semiconductor mounting method of the present invention is naturally applicable to various other electronic apparatuses such as a video camera.

Industrial Applicability

As described above, an inter-electrode connection structure, an inter-electrode connection method, a semiconductor device, a semiconductor mounting method, a liquid crystal device, and an electronic apparatus of the present invention are provided when conductive connection between elements such as electrodes is effected by means of conductive paste sprayed in the form of particles and are very effective when effecting conductive connection between electrodes arranged at a minute pitch of 80 µm or less, in particular, 50 µm or less, and is very useful from the industrial point of view as a technique playing a role in the micro processing technique related to semiconductor devices, liquid crystal devices, electronic apparatuses or the like.

What is claimed is:

1. An inter-electrode connection method for effecting conductive connection between substrate side electrodes formed on a substrate and element side electrodes formed on an electronic element to be mounted on the substrate, the method comprising:

arranging the substrate side electrodes and the element side electrodes so as to be in contact with or close to each other; and discretely spraying a conductive paste as particles to localized contact or proximity portions of the substrate side and element side electrodes to connect the electrodes to each other through the conductive paste.

2. The method of claim 1 wherein said conductive paste is only sprayed onto said substrate side and element side electrodes.

3. The method of claim 1 wherein said step of discretely spraying said conductive paste further comprises moving a spray nozzle along at least one of the substrate side electrodes and the element side electrodes and selectively emitting said conductive paste from said spray nozzle.

4. The method of claim 3 wherein said spray nozzle is angled relative to the substrate side electrodes and the element side electrodes.

5. The method of claim 3 wherein said step of selectively emitting said conductive paste further comprises supplying electricity to a piezoelectric element of said spray nozzle.

6. The method of claim 3 wherein said step of selectively emitting said conductive paste further comprises generating a bubble by local heating.

7. A semiconductor mounting method for connecting a semiconductor device which has a built-in semiconductor and which is equipped with a plurality of externally exposed electrodes to electrodes of an external substrate, the method comprising:

positioning the semiconductor device proximate the external substrate;

discretely spraying a conductive paste as particles to the electrodes of the external substrate or the electrodes of the semiconductor device; and attaching the semiconductor device and the external substrate to each other with the conductive paste.

8. The method of claim 7 wherein said conductive paste is only sprayed onto the electrodes of the external substrate or the electrodes of the semiconductor device.

9. The method of claim 7 wherein said step of discretely spraying said conductive paste further comprises moving a spray nozzle along at least one of the electrodes of the external substrate and the electrodes of the semiconductor device and selectively emitting said conductive paste from said spray nozzle.

10. The method of claim 9 wherein said spray nozzle is angled relative to the electrodes of the external substrate and the electrodes of the semiconductor device.

11. The method of claim 9 wherein said step of selectively emitting said conductive paste further comprises supplying electricity to a piezoelectric element of said spray nozzle.

12. The method of claim 9 wherein said step of selectively emitting said conductive paste further comprises generating a bubble by local heating.

13. The semiconductor mounting method according to claim 7, wherein after attaching the semiconductor device and the external substrate to each other, the semiconductor device is firmly attached to the external substrate by means of a curing resin.

14. The semiconductor mounting method according to claim 7, wherein the step of spraying the conductive paste or particles is executed a plurality of times on the same part of at least either the external substrate or the semiconductor device.

15. The semiconductor mounting method according to claim 14, wherein a drying process is executed on the conductive paste sprayed on at least either the external substrate or the semiconductor device before the next spraying of conductive paste.

16. A method of forming an electrode connection structure comprising:

providing a substrate having first electrodes formed thereon;

providing an electronic element having second electrodes formed thereon; and interconnecting said first electrodes and said second electrodes by discretely spraying a conductive paste as particles therebetween.

17. The method of claim 16 wherein said conductive paste is only sprayed onto said first and second electrodes.

18. The method of claim 16 wherein said step of discretely spraying said conductive paste further comprises moving a spray nozzle along at least one of the first and second electrodes and selectively emitting said conductive paste from said spray nozzle.

19. The method of claim 18 wherein said spray nozzle is angled relative to the first and second electrodes.

20. The method of claim 18 wherein said step of selectively emitting said conductive paste further comprises supplying electricity to a piezoelectric element of said spray nozzle.

21. The method of claim 18 wherein said step of selectively emitting said conductive paste further comprises generating a bubble by local heating.

22. The method of claim 16 wherein said first electrodes are placed proximate said second electrodes prior to said conductive paste being sprayed therebetween.

23. The method of claim 16 wherein said conductive paste is sprayed onto at least one of said first and second electrodes before said first and second electrodes are placed proximate one another.

24. The method of claim 16 wherein said conductive paste is sprayed onto at least one of said first and second electrodes a plurality of times to yield a raised mass of said conductive paste.

25. The method of claim 24 wherein said conductive paste is dried between consecutive applications.

26. The method of claim 16 further comprising interconnecting said substrate and said electronic element with a curing resin.

27. The method of claim 16 wherein said substrate further comprises a light transmitting substrate of a liquid crystal panel and said electronic element further comprises a liquid crystal driving integrated circuit of a glass substrate.

28. The method of claim 16 wherein said substrate further comprises a printed circuit board and said electronic element further comprises a multi-layer integrated circuit.

29. The method of claim 16 wherein said substrate further comprises a printed circuit board and said electronic equipment further comprises a plastic film liquid crystal panel.

30. An apparatus for conductivity interconnecting first electrodes on a substrate with second electrodes on an electronic element comprising:
- a conductive paste supply;
- a conduit communicating with said conductive paste supply; and
- a movable paste spraying device communicating with said conduit, said movable paste spraying device being adapted to discretely spray said conductive paste onto said first and second electrodes.

31. The apparatus of claim 30 wherein said movable paste spray device is linearly movable along a line of said first or second electrodes.

32. The apparatus of claim 30 wherein said movable paste spray device further comprises:
- a head main body including a paste chamber; and
- an ejection nozzle coupled to said head main body and including a duct communicating with said paste chamber.

33. The apparatus of claim 32 wherein said head main body further comprises an oscillation plate selectively changing a volume of said paste chamber.

34. The apparatus of claim 33 wherein said oscillation plate further comprises a piezoelectric element.

35. The apparatus of claim 30 wherein said movable paste spray device is angled relative to said first or second electrodes.

* * * * *

UNITED STATES PATENT AND TRADEMARK OFFICE
CERTIFICATE OF CORRECTION

PATENT NO.    : 6,357,111 B1
DATED         : March 19, 2002
INVENTOR(S)   : Uchiyama It is certified that error appears in the above-identified patent and that said Letters Patent is hereby corrected as shown below:

<u>Column 3,</u>
Line 29, "sandwitching" should read -- sandwiching --

<u>Column 6,</u>
Line 35, "a" should be -- an --

<u>Column 8,</u>
Line 18, delete "all"

<u>Column 10,</u>
Line 50, "a" should be -- an --

<u>Column 11,</u>
Line 51, "respect" should be -- respective --

Signed and Sealed this

Eighth Day of October, 2002

*Attest:*

*Attesting Officer*

JAMES E. ROGAN
*Director of the United States Patent and Trademark Office*